US012589414B2

(12) United States Patent
Son et al.

(10) Patent No.: US 12,589,414 B2
(45) Date of Patent: Mar. 31, 2026

(54) FLUID SUPPLY DEVICE AND WAFER CLEANING APPARATUS USING THE SAME

(71) Applicant: SEMES CO., LTD., Cheonan-si (KR)

(72) Inventors: Dong Hee Son, Hwaseong-si (KR); Seong Soo Lee, Suwon-si (KR); Jeong Bin Lee, Hwaseong-si (KR); Sun Mi Kim, Yeongam-gun (KR)

(73) Assignee: SEMES CO., LTD., Cheonan-si (KR)

( * ) Notice: Subject to any disclaimer, the term of this patent is extended or adjusted under 35 U.S.C. 154(b) by 211 days.

(21) Appl. No.: 18/231,720

(22) Filed: Aug. 8, 2023

(65) Prior Publication Data

US 2024/0058845 A1    Feb. 22, 2024

(30) Foreign Application Priority Data

Aug. 16, 2022    (KR) ........................ 10-2022-0102174

(51) Int. Cl.
| | |
|---|---|
| *B08B 3/02* | (2006.01) |
| *B08B 3/08* | (2006.01) |
| *B08B 13/00* | (2006.01) |
| *H01L 21/67* | (2006.01) |

(52) U.S. Cl.
CPC .................. *B08B 3/02* (2013.01); *B08B 3/08* (2013.01); *B08B 13/00* (2013.01); *H01L 21/67023* (2013.01)

(58) Field of Classification Search
CPC .... B08B 3/02; B08B 3/04; B08B 3/08; B08B 13/00; H01L 21/67017; H01L 21/67023; H01L 21/67028; H01L 21/6704; H01L 21/67051; H01L 21/67057;

(Continued)

(56) References Cited

U.S. PATENT DOCUMENTS

| | | | |
|---|---|---|---|
| 6,119,709 A | 9/2000 | Kiyota | |
| 10,591,935 B2 | 3/2020 | Takaki et al. | |
| 11,069,542 B2 * | 7/2021 | Morita | .............. H01L 21/67017 |

(Continued)

FOREIGN PATENT DOCUMENTS

| | | |
|---|---|---|
| JP | 1998-004077 | 1/1998 |
| JP | 3557354 | 5/2004 |

(Continued)

OTHER PUBLICATIONS

Office Action of the Korean Intellectual Property Office dated Oct. 19, 2023.

*Primary Examiner* — David G Cormier

(57) ABSTRACT

A fluid supply device and a wafer cleaning apparatus using the same are proposed. The fluid supply device is improved to minimize occurrence of particles generated in an operational process in order to reduce contamination of a wafer. The fluid supply device includes a supply tube connected to a supply tank storing a liquid chemical and a supply valve, a drain tube connected to the supply tube by a branch tube and a drain valve, a fluid tank, a provision tube connected to the supply tube via the branch tube to provide the liquid chemical into the fluid tank, a supply valve, a tank drain tube connected to the fluid tank to drain a liquid chemical in the fluid tank, and a tank drain valve, and a controller configured to control opening and closing of each of the valves and supply of the liquid chemical supplying through the supply tube.

20 Claims, 11 Drawing Sheets

(58) Field of Classification Search
CPC ......... H01L 21/67063; H01L 21/67075; H01L
21/6708; H01L 21/67086
See application file for complete search history.

(56) References Cited

U.S. PATENT DOCUMENTS

| | | | |
|---|---|---|---|
| 2016/0002789 A1 | 1/2016 | Kontani et al. | |
| 2022/0208568 A1 | 6/2022 | Ha et al. | |

FOREIGN PATENT DOCUMENTS

| | | |
|---|---|---|
| JP | 6038288 | 11/2016 |
| JP | 2018-142740 | 9/2018 |
| KR | 10-2020-0060484 | 5/2020 |
| KR | 10-2022-0093570 | 7/2022 |
| WO | 2019-082662 | 5/2019 |

* cited by examiner

[FIG 1]
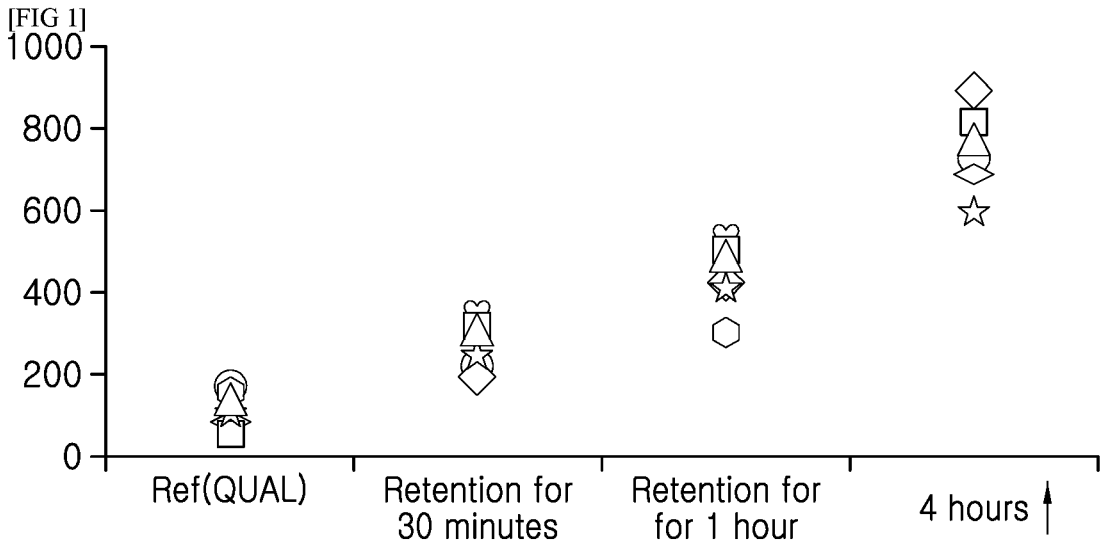
[FIG 2]
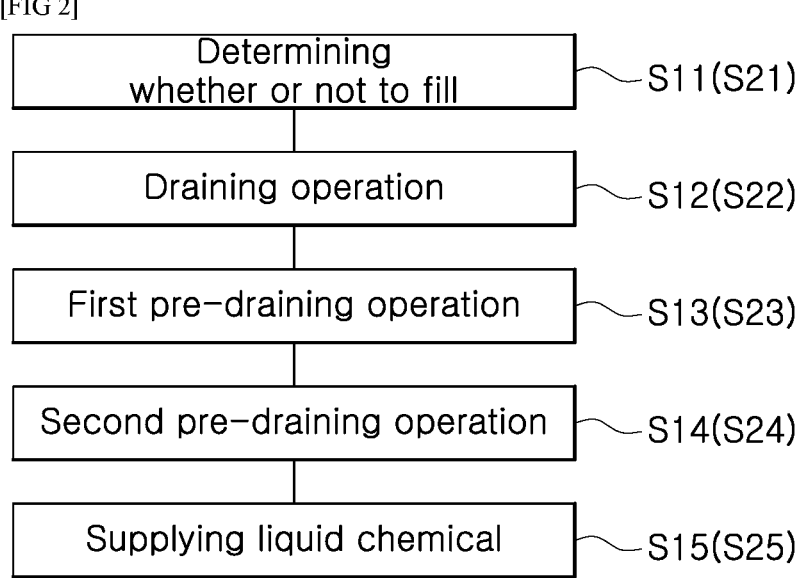

[FIG 3]

| ◯ Valve ON |
| ⊗ Valve OFF |

[FIG 4]
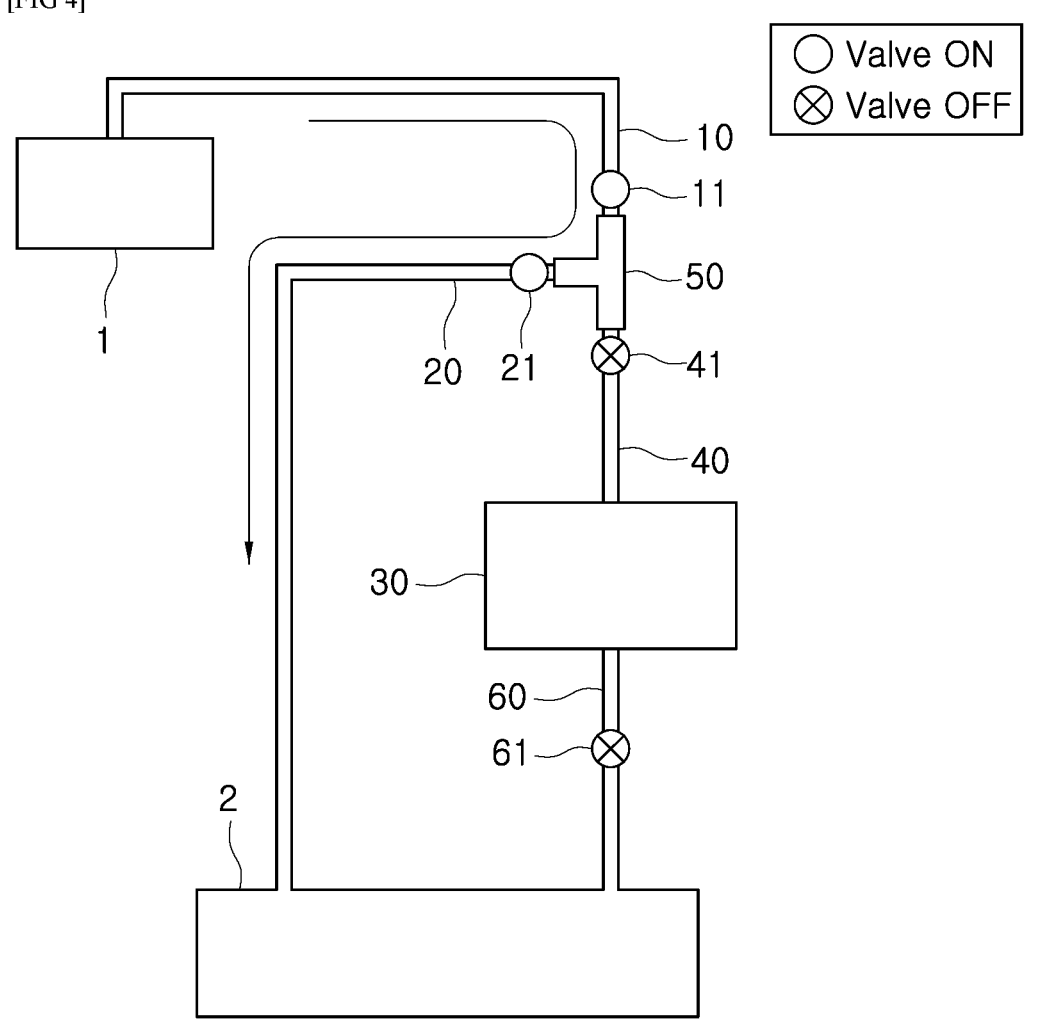

[FIG 5]
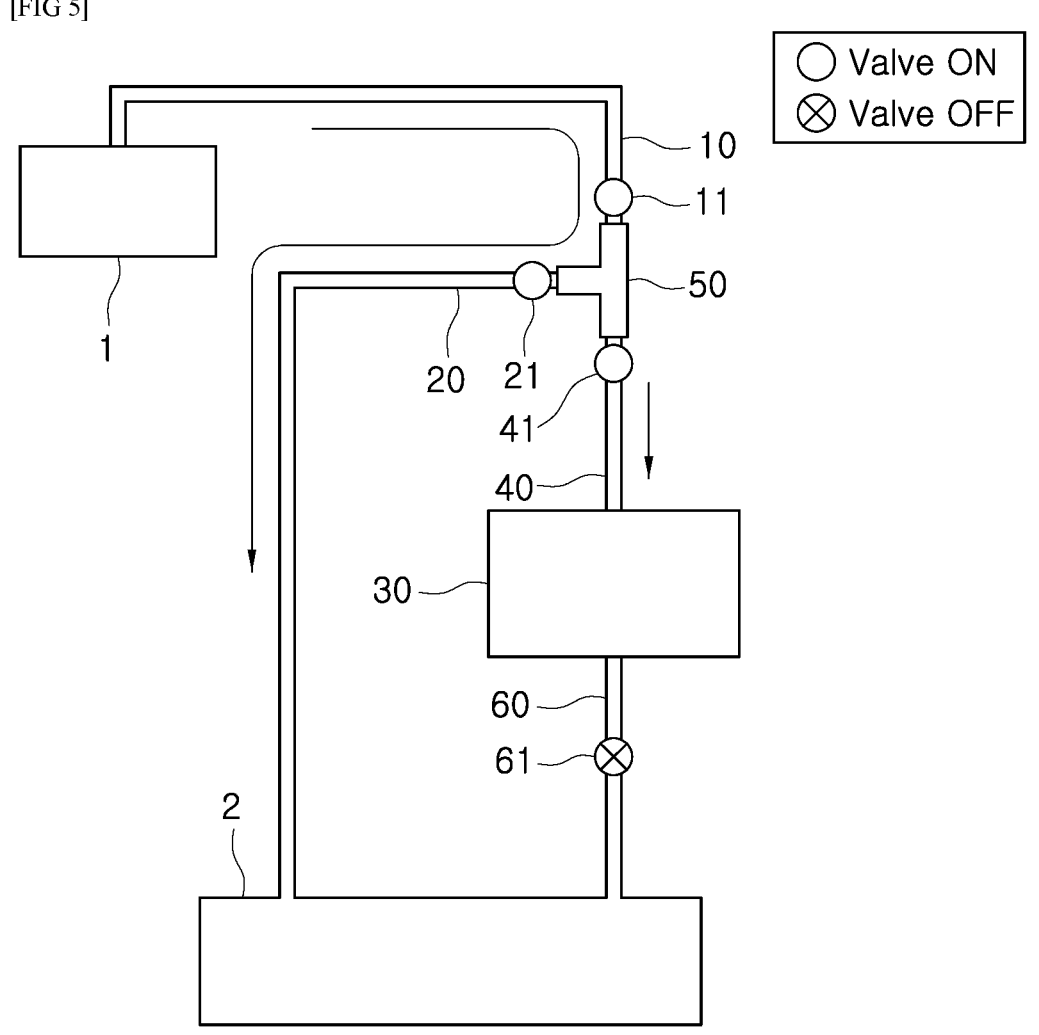

[FIG 6]
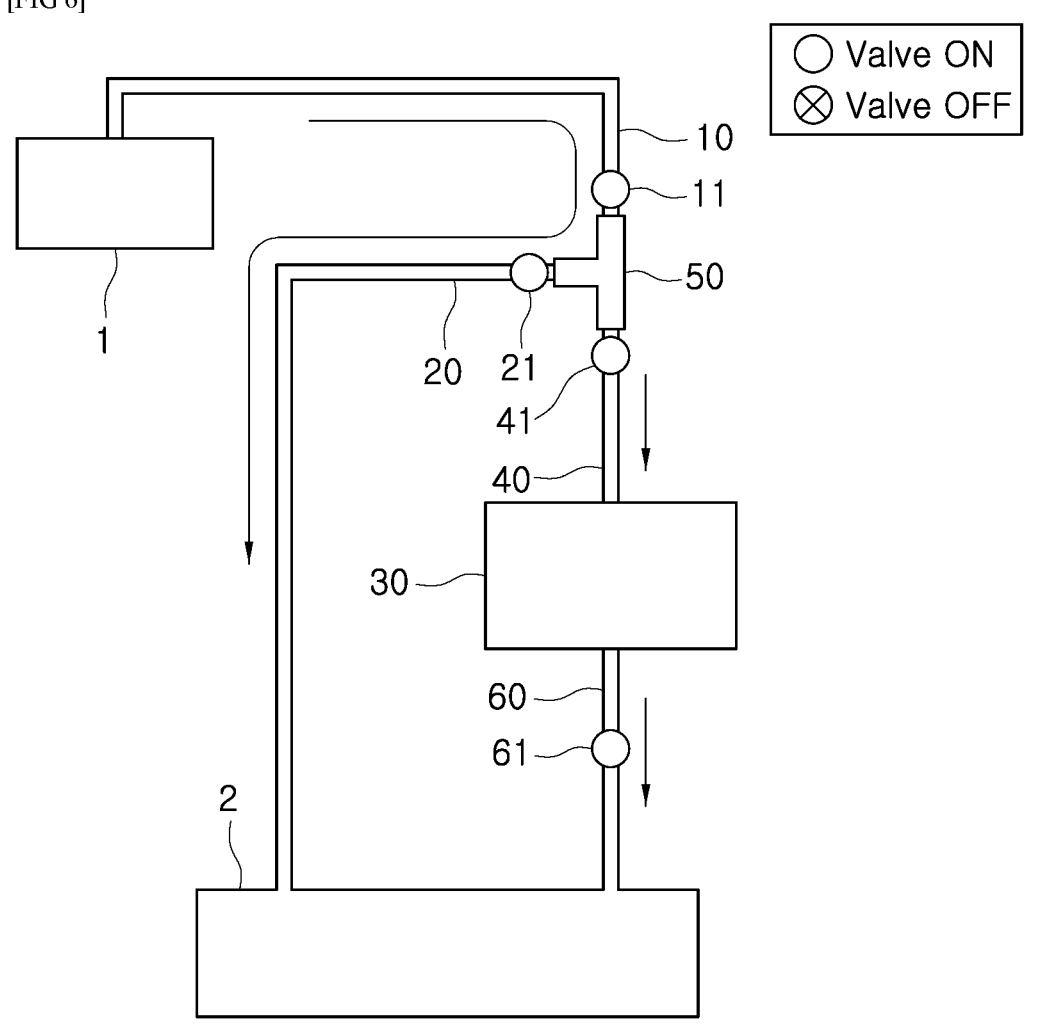

[FIG 7]

[FIG 8]
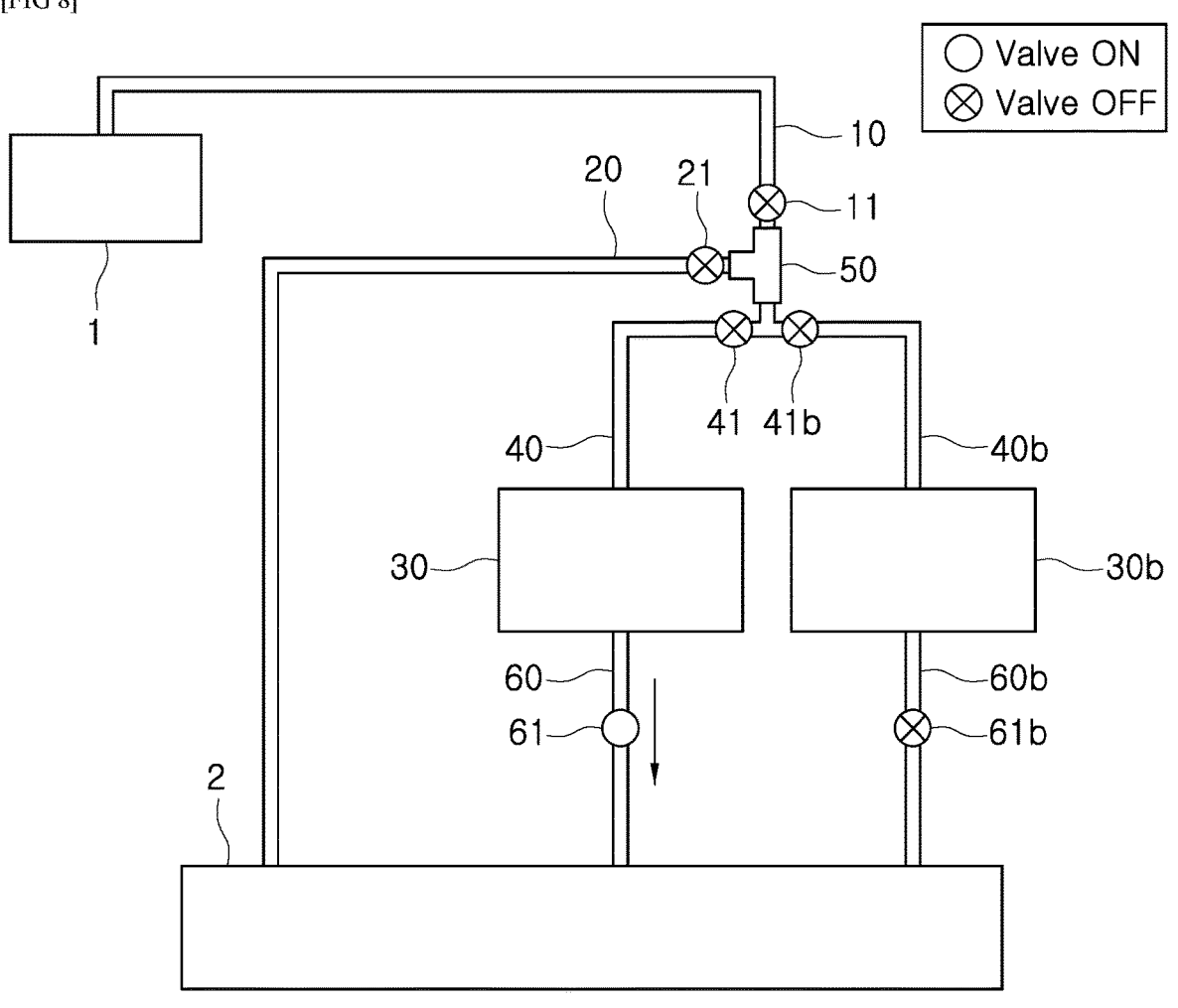

[FIG 9]
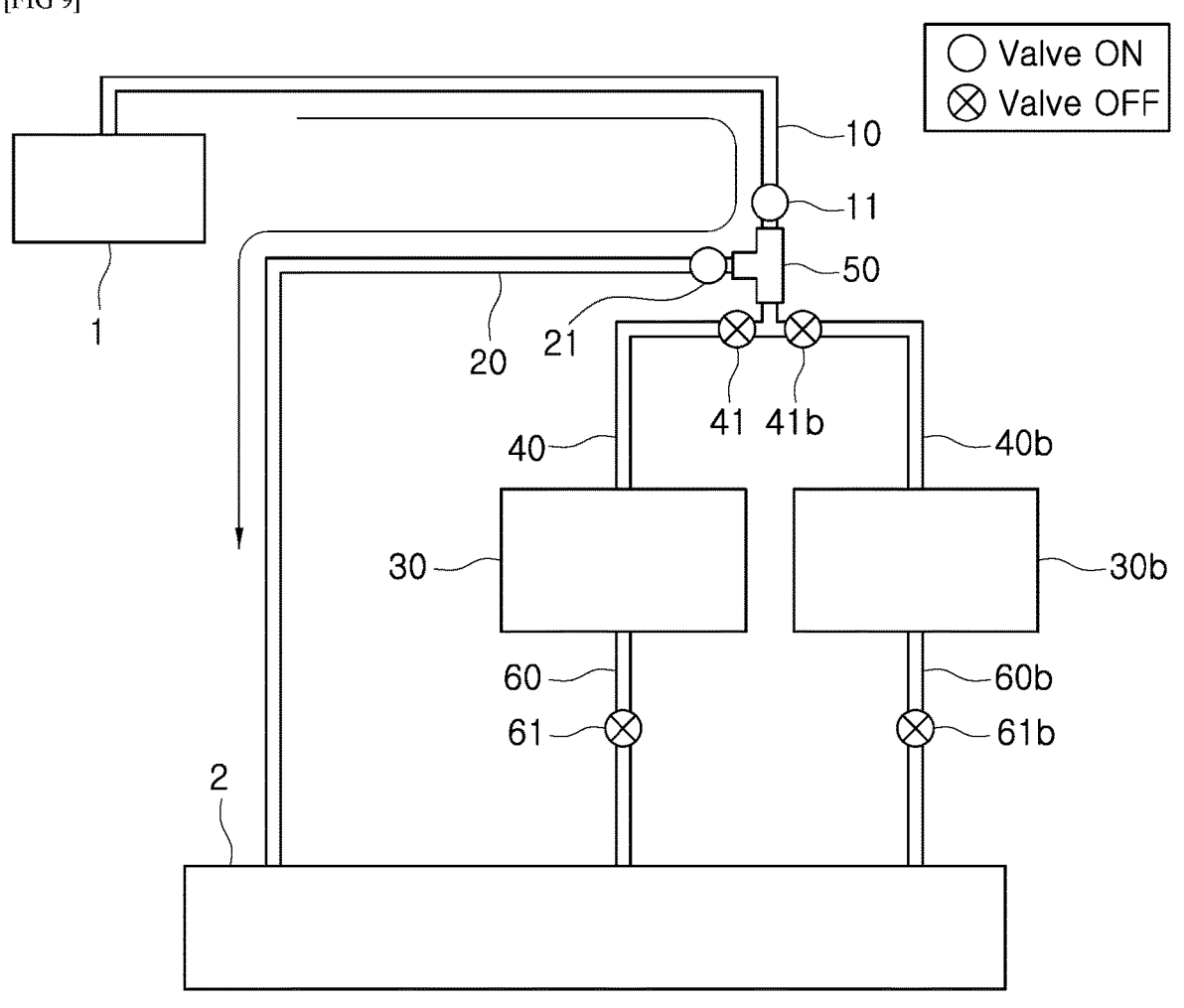

[FIG 10]
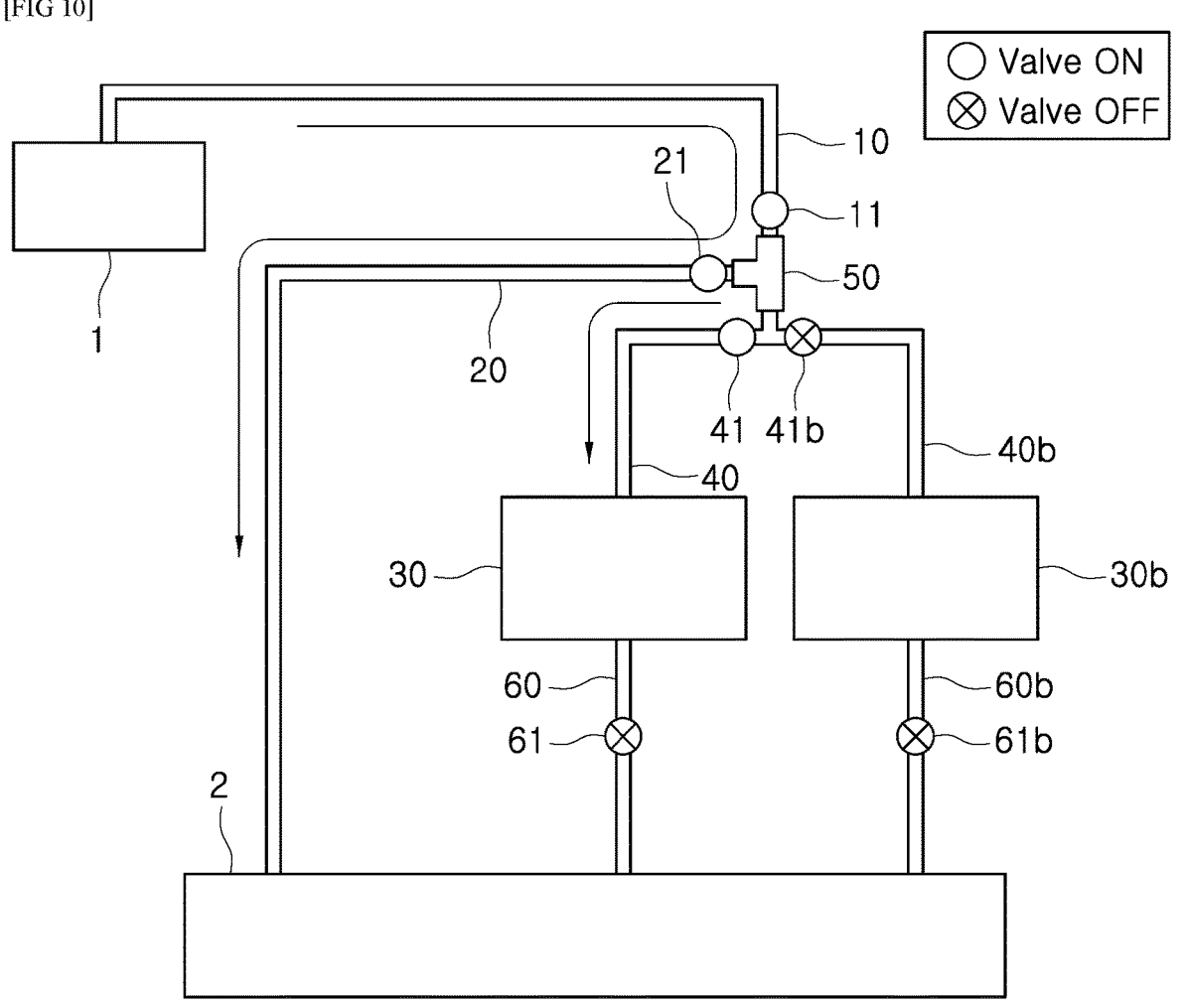

[FIG 11]
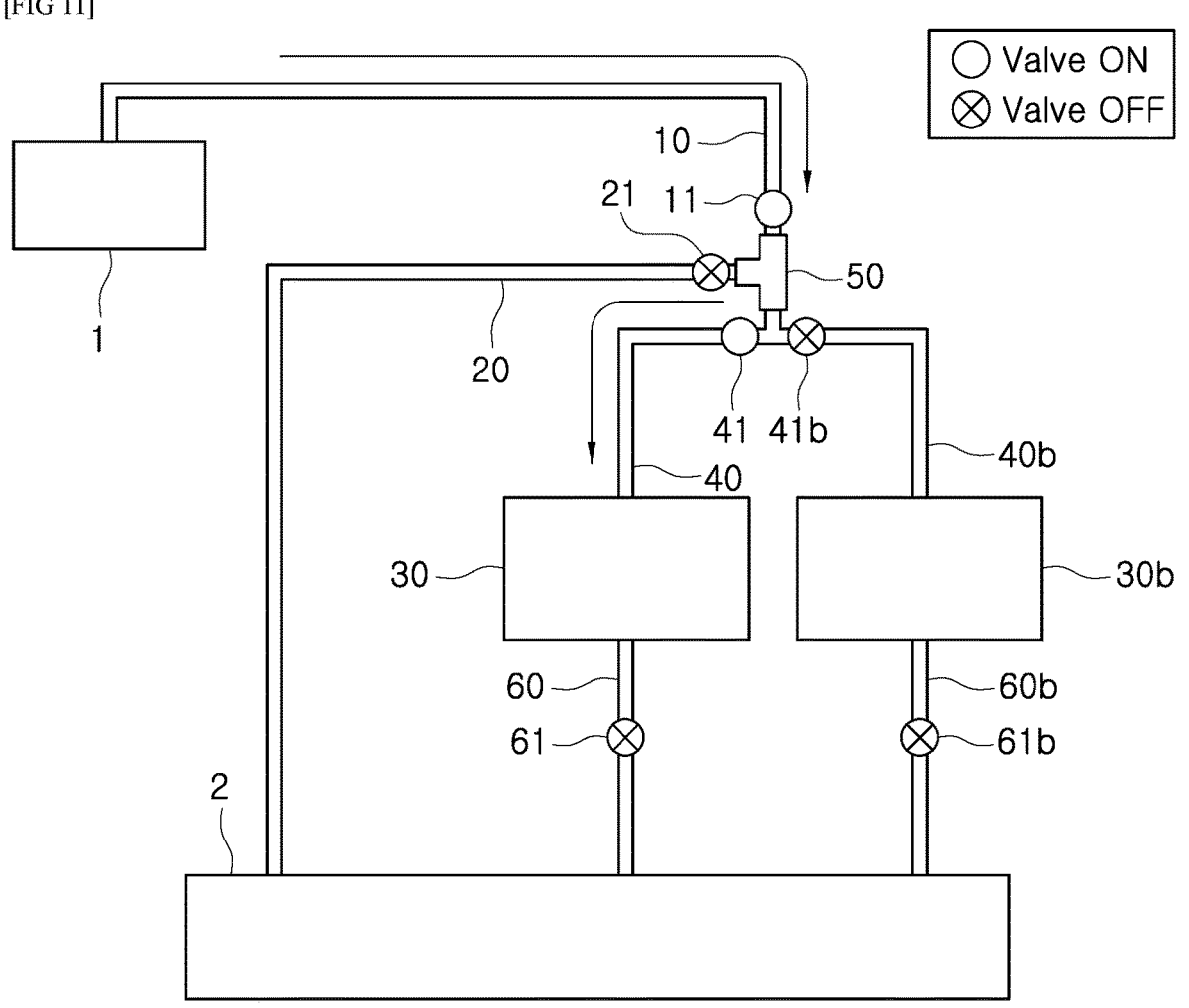

[FIG 12]
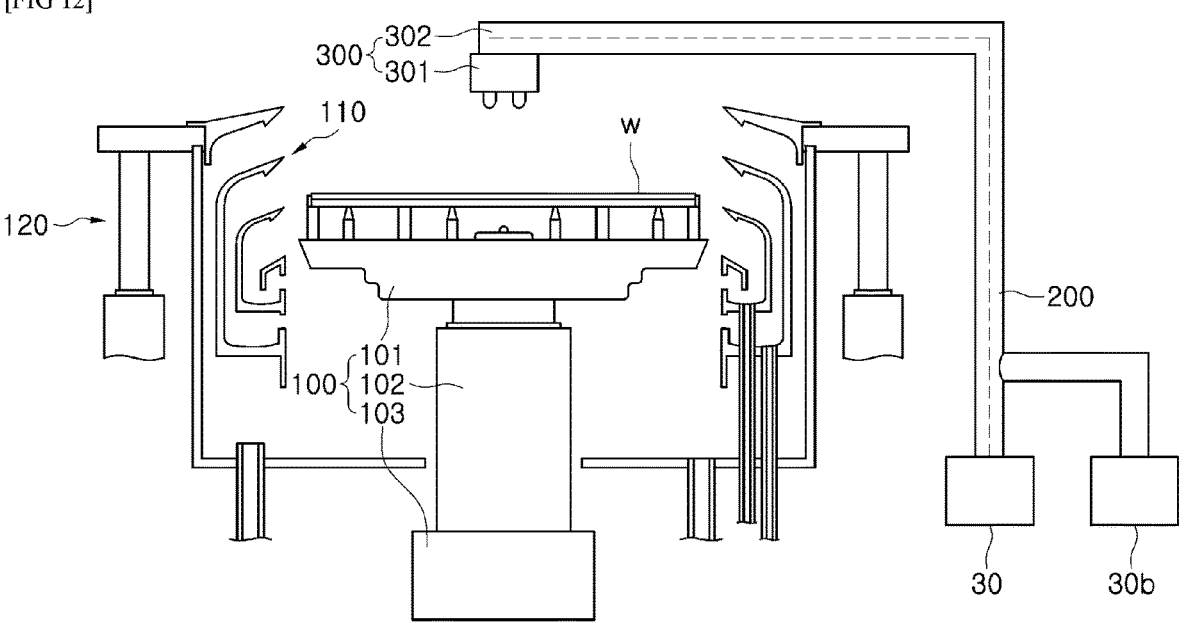

FLUID SUPPLY DEVICE AND WAFER CLEANING APPARATUS USING THE SAME

CROSS REFERENCE TO RELATED APPLICATION

The present application claims priority to Korean Patent Application No. 10-2022-0102174, filed Aug. 16, 2022, the entire contents of which is incorporated herein for all purposes by this reference.

BACKGROUND OF THE INVENTION

Field of the Invention

The present disclosure relates to a fluid supply device and a wafer cleaning apparatus using the same and, more particularly, to a fluid supply device and a wafer cleaning apparatus using the same, the fluid supply device being improved to minimize occurrence of particles generated in an operational process in order to reduce contamination of a wafer.

Description of the Related Art

In general, semiconductor devices are manufactured by repeatedly performing various unit processes such as depositing, photographing, etching, polishing, cleaning, etc.

In the semiconductor manufacturing process, many types of liquid chemicals are used, and as representative examples thereof include IPA solution and HF solution used in a wafer cleaning process, wafer coating liquid and thinner, HMDS, etc.

A fluid supply device is used to stably supply a liquid chemical to a semiconductor process that requires the liquid chemical, and the fluid supply device includes a fluid tank for storing the liquid chemical therein.

It can be confirmed experimentally that the longer the liquid chemical stays in the tank or pipe, the greater a contamination level of the wafer by particles. FIG. 1 is a graph showing relationship between a retention time of a liquid chemical and a contamination level of a water. The x-axis indicates a retention time of a liquid chemical in a tank and the y-axis indicates a value of measuring the number of surface particles of a generated wafer. The experimental results show the relationship between the time of a liquid chemical detained in the tank and the number of particles on the wafer surface, but it can be reasonably deduced that the number of particles contaminating the wafer will increase even when the retention time in the pipe is increased, so it is also necessary to properly remove a liquid chemical that has remained in the pipe for a long time.

Conventionally, when a life time of the liquid chemical stored in the fluid tank has expired or most of the liquid chemical in the fluid tank is used and there is a need to newly fill the fluid tank with a liquid chemical, all the liquid chemical remaining in the fluid tank is drained and a liquid chemical is newly filled. As described above, there is a possibility of particles present in the liquid chemical remaining in a tube of a supply line, and there is a possibility of the fluid tank due to particles generated in a valve operating process.

SUMMARY OF THE INVENTION

The present disclosure has been made keeping in mind the above problems occurring in the related art, and an objective of the present disclosure is to provide a fluid supply device and a wafer cleaning apparatus using the same, the fluid supply device being configured to efficiently reduce generation of particles generated in a process of newly supplying a liquid chemical into a fluid tank.

In order to achieve the above objective, the present disclosure provides a fluid supply device comprising:

a supply tank storing a liquid chemical;

a supply tube connected to a supply tank;

a supply valve provided at the supply tube;

a branch tube connected to the supply tube;

a drain tube connected to the supply tube via the branch tube;

a drain valve provided at the drain tube;

a provision tube connected to the branch tube;

a fluid tank connected to the provision tube;

a provision valve provided at the provision tube, wherein the liquid chemical is provided into the fluid tank via the supply tube, the provision tube, and the branch tube connecting the supply tube and the provision tube with each other;

a tank drain tube connected to the fluid tank to drain a liquid chemical in the fluid tank;

a tank drain valve provided at the tank drain tube; and a controller configured to control opening and closing of each of the supply valve, the drain valve, the provision valve, and the tank drain valve to supply the liquid chemical from the supply tank to the fluid tank, wherein controller is configured to perform:

a first pre-draining operation, in which, during a time when the supply valve and the drain valve are opened and the provision valve is closed, the liquid chemical is supplied via the supply tube from the supply tank to drain the liquid chemical detained in the supply tube and the liquid chemical supplied via the supply tube via the drain tube for a preset time;

a second pre-draining operation, in which after the first pre-draining operation is completed, during a time when the provision valve is opened, the liquid chemical is supplied via the supply tube from the supply tank, some of the supplied liquid chemical is discharged via the drain tube, and some of the supplied liquid chemical is supplied to the fluid tank via the supply tube and the provision tube; and a liquid supplying operation, in which, after the second pre-draining operation is completed, during a time when the opened drain valve is closed, the liquid chemical is supplied to the fluid tank via the supply tube, the provision tube, and the branch tube connecting the supply tube and the provision tube with each other.

The controller may be configured to further perform:

draining operation that drains the fluid tank, before the first pre-draining operation is performed, during a time when the tank drain valve is opened to drain a liquid chemical stored in the fluid tank via the tank drain tube.

The controller may be configured to perform determining whether or not to fill a liquid chemical into the fluid tank, and wherein, when it is determined to fill the liquid chemical in the fluid tank, the first pre-draining operation, the second pre-draining operation, and the liquid supplying operation are performed.

The controller may be configured to perform determining whether or not to fill a liquid chemical into the fluid tank, and wherein, when it is determined that the liquid chemical is filled into the fluid tank, the draining of the fluid tank, the first pre-draining operation, the second pre-draining operation, and the liquid supplying operation are performed.

A level sensor may be provided at the fluid tank to detect a level of the liquid chemical, and wherein the determining whether or not to fill a liquid chemical is performed by considering a level of the liquid chemical remaining in the fluid tank detected by the level sensor.

The determining whether or not to fill a liquid chemical may be performed by considering a retention time of liquid chemical filled in the fluid tank.

During the second pre-draining operation, the tank drain valve is configured to be opened to drain the liquid chemical supplied to the fluid tank for a preset time, and wherein, during the liquid supplying operation, the tank drain valve is configured to be closed and the liquid chemical is stored in the fluid tank.

In order to achieve the above objective, the present disclosure also provides a fluid supply device comprising:

a supply tank storing a liquid chemical;
a supply tube connected to a supply tank;
a supply valve provided at the supply tube;
a branch tube connected to the supply tube;
a drain tube connected to the supply tube via the branch tube;
a drain valve provided at the drain tube;
a provision tube connected to the branch tube;
a provision valve provided at the provision tube;
a first fluid tank connected to the provision tube, wherein the liquid chemical is provided into the first fluid tank via the supply tube, the provision tube, and the branch tube connecting the supply tube and the provision tube with each other;
a first tank drain tube connected to the first fluid tank to drain a liquid chemical in the first fluid tank;
a first tank drain valve provided at the first tank drain tube;
a second provision tube connected to the branch tube;
a second provision valve provided at the second provision tube;
a second fluid tank connected to the second provision tube;
a second tank drain tube connected to second fluid tank to drain a liquid chemical in second fluid tank;
a second tank drain valve provided at the second tank drain tube; and
a controller configured to control opening and closing of each of the supply valve, the drain valve, the provision valve, the first tank drain valve, the second tank drain valve, to supply the liquid chemical from the supply tank to the first fluid tank or the second fluid tank, wherein, the controller is configured to perform:
a first pre-draining operation, in which, during a time when the supply valve and the drain valve are opened and the provision valve and the second provision valve are closed, the liquid chemical is supplied via the supply tube from the supply tank to drain the liquid chemical detained in the supply tube and the liquid chemical supplied via the supply tube via the drain tube for a preset time;
a second pre-draining operation, in which after the first pre-draining operation is completed, during a time when the supply valve is opened and the liquid chemical is supplied via the supply tube from the supply tank some of the supplied liquid chemical is discharged via the drain tube, and some of the supplied liquid chemical is supplied to the first fluid tank or the second fluid tank via the provision tube or the second provision tube; and
a liquid supplying operation, in which, after the second pre-draining operation is completed, during a time when the opened drain valve is closed, the liquid chemical is selectively supplied to the first fluid tank or the second fluid tank via the supply tube and the provision tube or the second provision tube.

The controller may be configured to further perform:
draining the first fluid tank, before the first pre-draining operation is performed, during a time when the first tank drain valve or the second tank drain valve is opened to drain the liquid chemical stored in the first fluid tank or the second fluid tank via the first tank drain tube or the second tank drain tube.

The controller may be configured to:
perform determining whether or not to fill a liquid chemical into the first fluid tank or the second fluid tank, and
perform, in response to the determination of filling the liquid chemical in the first fluid tank or the second fluid tank, the first pre-draining operation, the second pre-draining operation, and the liquid supplying operation.

The controller is configured to perform determining whether or not to fill a liquid chemical into the first fluid tank or the second fluid tank, and wherein, when it is determined that the liquid chemical is filled into the first fluid tank or the second fluid tank, the draining of the first fluid tank, the first pre-draining operation, the second pre-draining operation, and liquid supplying operation are performed.

A level sensor may be provided at the first fluid tank or the second fluid tank to detect a level of the liquid chemical, and wherein the determining whether or not to fill a liquid chemical is performed based on a level of the liquid chemical remaining in the first fluid tank or the second fluid tank detected by the level sensor.

The determining whether or not to fill a liquid chemical is performed based on a retention time of liquid chemical filled in the first fluid tank or the second fluid tank.

During the second pre-draining operation, the first tank drain valve or the second tank drain valve may be configured to be opened to drain the liquid chemical supplied to the first fluid tank or the second fluid tank for a preset time, and wherein, during the liquid supplying operation, the first tank drain valve or the second tank drain valve is configured to be closed and the liquid chemical is stored in the first fluid tank or the second fluid tank.

The first fluid tank and the second fluid tank may be configured to selectively supply the liquid chemical to a cleaning apparatus attached to the fluid supply device.

In order to achieve the above objective, the present disclosure provides a wafer cleaning apparatus comprising a fluid supply means and a cleaning means, wherein the fluid supply means comprises:
a supply tank storing a liquid chemical;
a supply tube connected to a supply tank;
a supply valve provided at the supply tube;
a branch tube connected to the supply tube;
a drain tube connected to the supply tube via the branch tube;
a drain valve provided at the drain tube;
a provision tube connected to the branch tube;
a provision valve provided at the provision tube;
a first fluid tank connected to the provision tube, wherein the liquid chemical is provided into the first fluid tank via the supply tube, the provision tube, and the branch tube connecting the supply tube and the provision tube with each other;

a first tank drain tube connected to the first fluid tank to drain a liquid chemical in the first fluid tank;

a first tank drain valve provided at the first tank drain tube;

a second provision tube connected to the branch tube;

a second provision valve provided at the second provision tube;

a second fluid tank connected to the second provision tube;

a second tank drain tube connected to second fluid tank to drain a liquid chemical in second fluid tank;

a second tank drain valve provided at the second tank drain tube; and a controller configured to control opening and closing of each of the supply valve, the drain valve, the provision valve, the first tank drain valve, the second tank drain valve, to supply the liquid chemical from the supply tank to the first fluid tank or the second fluid tank, wherein the controller is configured to perform:

determining whether or not the first fluid tank or the second fluid tank is filled with the liquid chemical;

draining operation, wherein the first tank drain valve or the second tank drain valve is opened to drain the liquid chemical stored in the first fluid tank or the second fluid tank via the first tank drain tube or the second tank drain tube;

a first pre-draining operation, in which, during a time when the supply valve and the drain valve are opened and the provision valve and the second provision valve are closed, the liquid chemical is supplied via the supply tube from the supply tank to drain the liquid chemical detained in the supply tube and the liquid chemical supplied via the supply tube via the drain tube for a preset time;

a second pre-draining operation, in which after the first pre-draining operation is completed, during a time when the provision valve is opened the liquid chemical is supplied via the supply tube from the supply tank some of the supplied liquid chemical is discharged via the drain tube, and some of the supplied liquid chemical is supplied to the first fluid tank or the second fluid tank via the provision tube or the second provision tube; and a liquid supplying operation, in which, after the second pre-draining operation is completed, during a time when the opened drain valve is closed, the liquid chemical is selectively supplied to the first fluid tank or the second fluid tank via the supply tube and the provision tube or the second provision tube, and wherein the cleaning means comprises:

a support unit configured to support a wafer;

a fluid supply unit configured to supply the liquid chemical from the first fluid tank or the second fluid tank; and a spray unit configured to spray the liquid chemical supplied by the fluid supply unit to the wafer in order to clean the wafer.

BRIEF DESCRIPTION OF THE DRAWINGS

FIG. 1 is a graph showing relationship between a retention time of a liquid chemical and the amount of particles on a wafer surface.

FIG. 2 is a flowchart showing a method for supplying a liquid chemical, the method being performed by a fluid supply device according to a first embodiment and a second embodiment of the present disclosure.

FIG. 3 is a view showing a draining operation of the fluid supply device according to the first embodiment of the present disclosure.

FIG. 4 is a view showing a first pre-draining operation of the fluid supply device according to the first embodiment of the present disclosure.

FIG. 5 is a view showing a second pre-draining operation of the fluid supply device according to the first embodiment of the present disclosure.

FIG. 6 is a view showing a second shape of the second pre-draining operation of the fluid supply device according to the first embodiment of the present disclosure.

FIG. 7 is a view showing supplying of a liquid chemical of the fluid supply device according to the first embodiment of the present disclosure.

FIG. 8 is a view showing the draining of the tank of the fluid supply device according to the second embodiment of the present disclosure.

FIG. 9 is a view showing the first pre-draining operation of the fluid supply device according to the second embodiment of the present disclosure.

FIG. 10 is a view showing the second pre-draining operation of the fluid supply device according to the second embodiment of the present disclosure.

FIG. 11 is a view showing the supplying of a liquid chemical of the fluid supply device according to the second embodiment of the present disclosure.

FIG. 12 is a view showing a wafer cleaning apparatus according to an embodiment of the present disclosure.

DETAILED DESCRIPTION OF THE INVENTION

Hereinbelow, exemplary embodiment of the present disclosure will be described with reference to accompanying drawings and specific details for embodying the present disclosure will be provided.

A fluid supply device according to a first embodiment of the present disclosure will be described.

Figure 3:
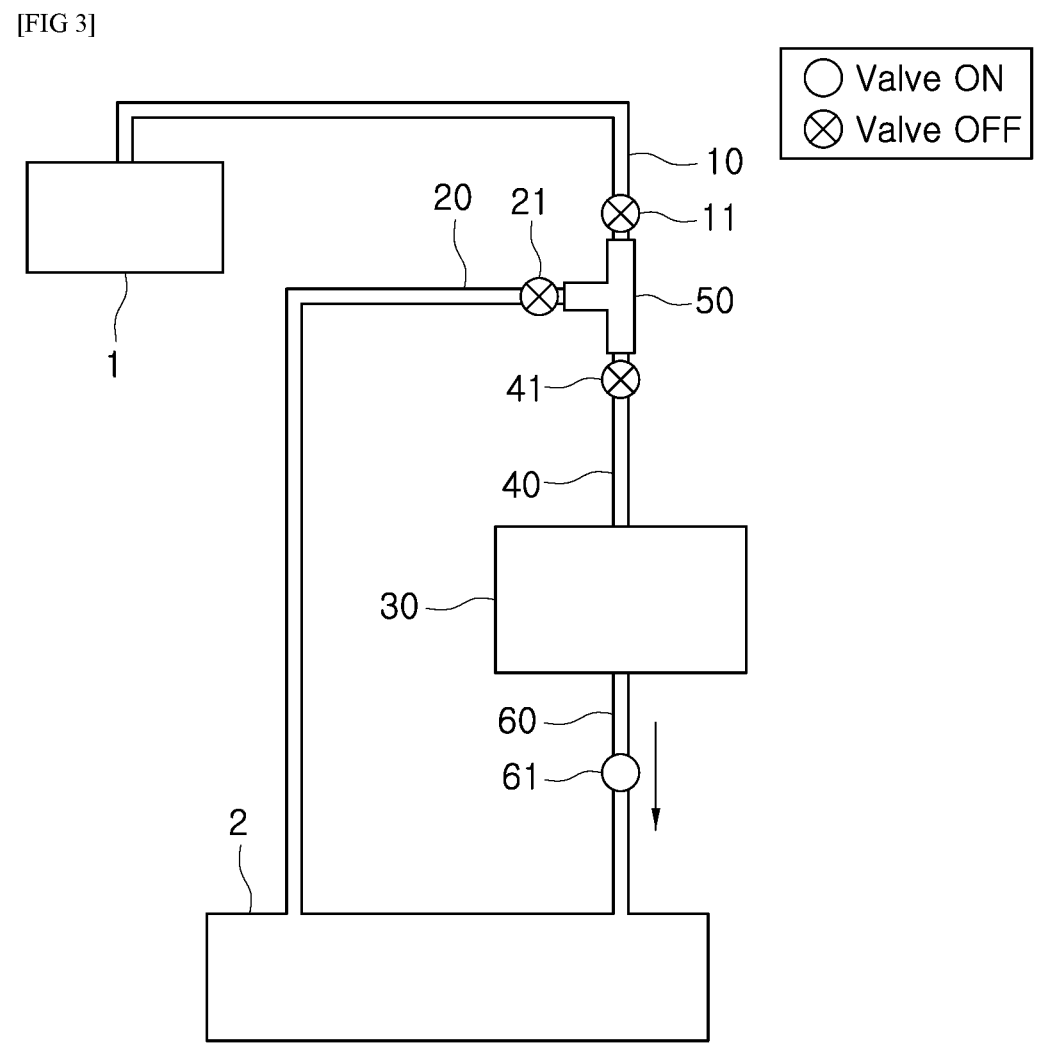
Figure 7:
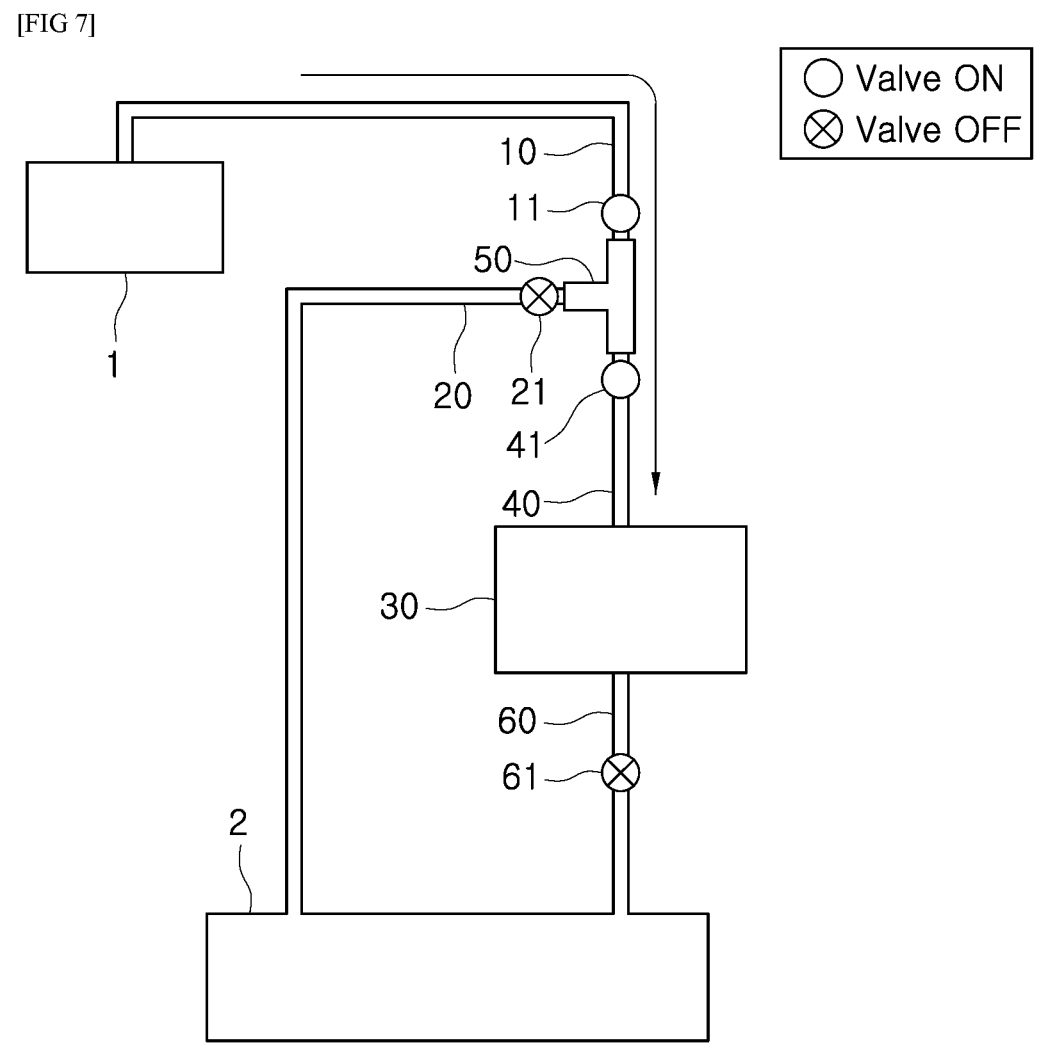

FIG. 2 is a flowchart showing a method for supplying a liquid chemical, the method being performed by a fluid supply device according to a first embodiment and a second embodiment of the present disclosure. FIG. 3 is a view showing draining operation of the fluid supply device according to the first embodiment of the present disclosure. FIG. 4 is a view showing first pre-draining of the fluid supply device according to the first embodiment of the present disclosure. FIG. 5 is a view showing second pre-draining operation of the fluid supply device according to the first embodiment of the present disclosure. FIG. 6 is a view showing a second shape of the second pre-draining operation of the fluid supply device according to the first embodiment of the present disclosure. FIG. 7 is a view showing supplying of a liquid chemical of the fluid supply device according to the first embodiment of the present disclosure. With valves shown in FIGS. 3 to 7, as indicated by the boxes in the drawings, "○" mark indicates an opened state of a valve, and "ⓧ" mark indicates a closed state of a valve.

According to the embodiment, the fluid supply device is related to as a device supplying a liquid chemical required in semiconductor equipment (mainly, wafer cleaning equipment). As the liquid chemical, SC1 for removing particles or organic contaminants from a wafer surface or implementing wafer surface hydrophilic, DHF for removing an oxide film or metal contaminants on a wafer surface; DHF for removing an oxide film or metal contaminants on a wafer surface, SPM for removing metal and organic contaminants, LAI, for removing ozone and an oxide film, etc. are used.

According to the embodiment, as shown in FIG. 3, the fluid supply device includes: a supply tank 1, a supply tube 10, a supply valve 11, a drain tube 20, a drain valve 21, the fluid tank 30, a provision tube 40, a provision valve 41, a branch tube 50, a tank drain tube 60, a tank drain valve 61, and a controller (not shown).

The supply tube 10 is connected to a supply tank 1 storing and supplying the liquid chemical. The supply valve 11 is provided at the supply tube 10.

The drain tube 20 is connected to the supply tube 10 via the branch tube 50 and discharges a liquid chemical staying in the supply tube 10 for a predetermined time, and the drain valve 21 is configured to allow or block a flow of fluid at the drain tube 20.

The fluid tank 30 is configured to store a liquid chemical therein to supply the liquid chemical to the cleaning equipment. A level sensor (not shown) may be provided at the fluid tank 30 to measure a level of the liquid chemical stored in the fluid tank 30.

The provision tube 40 is connected to the supply tube 10 via the branch tube 50 to supply a liquid chemical to the fluid tank 30, and the provision valve 41 is configured to allow or block a flow of fluid at the provision tube 40.

The branch tube 50 may have a T shape, and connects the supply tube 10, the drain tube 20, and the provision tube 40 to each other.

The tank drain tube 60 is connected to the fluid tank 30 to drain the liquid chemical stored in the fluid tank 30, and the tank drain valve 61 is configured to allow or block a flow of fluid in the tank drain tube 60.

The controller (not shown) controls opening and closing of each of the supply valve 11, the drain valve 21, the provision valve 41, and the tank drain valve 61 to supply the liquid chemical from the supply tank 1 to the fluid tank 30.

The controller performs a first pre-draining operation and a second pre-draining operation.

Hereinbelow, a method for supplying, by the controller, a liquid chemical to the fluid tank 30 will be described. The method for supplying a liquid chemical to the fluid tank 30 is controlled by the controller. As shown in FIG. 2, the method is performed in order of determining whether or not to fill a liquid chemical S11, draining operation S12, first pre-draining operation S13, second pre-draining operation S14, and supplying of a liquid chemical S15.

The determining whether or not to fill a liquid chemical S11 is performed by determining whether or not filling (supply) of a liquid chemical to the fluid tank 30 is required. According to a result of the determining whether or not to fill a liquid chemical, when it is determined that supply of a liquid chemical is required, the draining of a tank S12, the first pre-draining operation S13, the second pre-draining operation S14, and the supplying of a liquid chemical S15 are performed.

In the determining whether or not to fill a liquid chemical S11, it may be determined whether or not filling of a liquid chemical is required, by considering a time elapsed after a liquid chemical is filled into the fluid tank 30 and a level, which is measured by the level sensor, of the liquid chemical stored in the fluid tank 30. When a time elapsed after the liquid chemical is filled into the fluid tank 30 is equal to or greater than a predetermined time (e.g., 300 minutes) or a level of the liquid chemical stored in the fluid tank 30 is less than or equal to a predetermined level (e.g., $\frac{1}{5}$ of level in full filling), newly filling of a liquid chemical may be performed.

The draining operation S12 is performed by draining the liquid chemical stored in the fluid tank 30, via the tank drain tube 60. To this end, as shown in FIG. 3, the tank drain valve 61 is opened to drain the liquid chemical inside the fluid tank 30. The liquid chemical stored in the fluid tank 30 for a long time has a tendency in which the amount of particles increases (referring to the graph in FIG. 1), and in some cases, physical properties required for the process are lowered, so that it is preferable that the liquid chemical stored in the fluid tank 30 is discharged before the liquid chemical is newly supplied and stored in the fluid tank 30. When draining of the liquid chemical stored in the fluid tank 30 is completed, the tank drain valve 61 is closed.

Meanwhile, the draining operation S12 may be omitted. In other words, while the liquid chemical remains in the fluid tank 30, a liquid chemical may be newly filled.

The first pre-draining operation S13 is performed to drain the liquid chemical detained in the supply tube 10. As shown in FIG. 4, the first pre-draining operation S13 is performed during the time when the supply valve 11 and the drain valve 21 are opened and the provision valve 41 is closed. Then, when the liquid chemical is supplied from the supply tank 1 via the supply tube 10, the supplied liquid chemical is drained via the drain tube 20 in a direction of the arrow shown in FIG. 4, and at this time, the liquid chemical detained in the supply tube 10 is drained together. As described above, since increased particles in the detained liquid chemical may worsen the physical properties of the liquid chemical, the liquid chemical detained in the supply tube 10 is removed. A time of performing the first pre-draining operation S13 may be determined depending on a fluid (liquid chemical) flow rate, and the first pre-draining operation S13 is performed longer than a time for all the liquid chemical detained in the supply tube 10 to be drained.

The second pre-draining operation S14 is performed by opening the provision valve 41 after the first pre-draining operation S13 is completed (the supply valve 11 and the drain valve 21 are opened) and supplying a liquid chemical via the supply tube 10 draining operation d). FIG. 5 shows a valve state and a flow (arrow) of fluid in the second pre-draining operation S14. Some of the liquid chemical supplied via the supply tube 10 is discharged via the drain tube 20 and some of the supplied liquid chemical is supplied to the fluid tank 30 via the provision tube 40.

A reason of going through the second pre-draining operation S14 is to minimize a probability that particles in the supply valve 11 flow into the fluid tank 30. If the drain valve 21 is closed after the first pre-draining draining operation S13, a flow of the fluid through the drain valve 21 stops. At this time, pressure in the supply valve 11 increases momentarily, and the internal pressure of the supply valve 11 increases, the increased pressure may cause the disturbance of detained fluid in the supply valve 11. The valve has a dead zone where a fluid is detained, and the fluid detained in the dead zone does not move unless disturbance occurs. Also, particles are generated inside the fluid detained in the dead zone and physical properties of the liquid chemical are deteriorated, so, if possible, it is preferable that the fluid detained in the dead zone continues to remain. However, after the first pre-draining operation S13 is completed and the drain valve 21 is closed, high pressure is applied to the supply valve 11 momentarily, so that disturbance may occurs in the dead zone in the supply valve 11. When disturbance occurs in the dead zone, the fluid detained in the dead zone may flow and the particles in the dead zone may be supplied into the fluid tank 30. Therefore, before the provision valve 41 is opened for the second pre-draining operation S14 together with the drain valve 21 are opened for a predetermined time, a possibility of disturbance occurrence in the dead zone can be significantly reduced.

After the completion of the first pre-draining operation S13, when both of the supply valve 11 and the drain valve 21 are closed and the supply valve 11 and the provision valve 41 are opened, particles are generated in the closing and opening operations of the supply valve 11. However, in the embodiment, an opened state of the supply valve 11 is maintained to minimize generation of the particles that may be generated in the valve opening and closing.

The time to maintain the second pre-draining operation S14 does not need to be long. Even when the provision valve 41 is opened for a short time, a possibility of occurrence of disturbance in the supply valve 11 is significantly reduced.

Meanwhile, as shown in FIG. 6, the second pre-draining operation S14 may be performed while the tank drain valve 61 is also opened. In the second pre-draining operation S14, all the liquid chemical flowing into the fluid tank 30 is drained via the tank drain tube 60. Since it is difficult to completely eliminate disturbance of the dead zone in the supply valve 11, all the liquid chemical flowing into the fluid tank 30 is drained for a predetermined time to minimize particles of the liquid chemical stored in the fluid tank 30.

The supplying of a liquid chemical S15 is performed by closing the drain valve 21 after the second pre-draining operation S14 to allow liquid chemical supplied via the supply tube 10 to be stored in the fluid tank 30 while passing through the provision tube 40. FIG. 7 shows a valve state and a flow of liquid chemical in the supplying of a liquid chemical S15.

When the supplying of a liquid chemical S15 is completed by closing the supply valve 11 and the provision valve 41, the liquid chemical may be supplied from the fluid tank 30 to a semiconductor manufacturing process such as the cleaning equipment.

Meanwhile, the level sensor may also be used in the supplying of a liquid chemical S15. The level sensor senses a level of the liquid chemical in the fluid tank 30, and when the level is a predetermined level, the supply of the liquid chemical is stopped.

The liquid chemical drained by both of the drain tube 20 and the tank drain tube 60 may be stored in a drain box 2.

Hereinbelow, the fluid supply device according to a second embodiment of the present disclosure will be described with reference to the accompanying drawings. In the embodiment, the fluid supply device has the similar configuration to the fluid supply device according to the first embodiment described above, so description of the characteristic configuration of the embodiment will be mainly focused on, and descriptions of some configurations will be briefly described.

FIG. 2 is a flowchart showing a method for supplying a liquid chemical, the method being performed by a fluid supply device according to a first embodiment and a second embodiment of the present disclosure. FIG. 8 is a view showing the tank-draining of the fluid supply device according to the second embodiment of the present disclosure. FIG. 9 is a view showing the first pre-draining operation of the fluid supply device according to the second embodiment of the present disclosure. FIG. 10 is a view showing the second pre-draining operation of the fluid supply device according to the second embodiment of the present disclosure. FIG. 11 is a view showing the supplying of a liquid chemical of the fluid supply device according to the second embodiment of the present disclosure.

With valves shown in FIGS. 8 to 11, as indicated by the boxes in the drawings, "○" mark indicates an opened state of a valve, and "ⓧ" mark indicates a closed state of a valve.

According to the embodiment, as shown in FIG. 8, the fluid supply device includes the supply tank 1, the supply tube 10, the supply valve 11, the drain tube 20, the drain valve 21, the fluid tank 30, a second fluid tank 30b, the provision tube 40, the provision valve 41, a second provision tube 40b, a second provision valve 41b, the branch tube 50, the tank drain tube 60, the tank drain valve 61, a second tank drain tube 60b, a second tank drain valve 61b, and the controller (not shown).

The branch tube 50 connects the supply tube 10, the drain tube 20, the provision tube 40, and the second provision tube 40b to each other. In the drawing, it is shown that the provision tube 40 and the second provision tube 40b are branched from a tube connected to the branch tube 50 and both of the provision tube 40 and the second provision tube 40b may be directly connected to the branch tube 50 and in this case, a shape of the branch tube may have a +shape, not a T shape.

The supply tube 10, the supply valve 11, the drain tube 20, the drain valve 21, the branch tube 50, the fluid tank 30, the provision tube 40, the provision valve 41, the tank drain tube 60, and the tank drain valve 61 are substantially the same to the configurations (configurations with the same numerals) of the first embodiment described above, so additional descriptions thereof will be omitted.

The second fluid tank 30b stores a liquid chemical therein like the fluid tank 30, and is provided together with the fluid tank 30 and selectively supplies the liquid chemical to the equipment (e.g., cleaning means) using the liquid chemical. For example, when a demand of filling a liquid chemical into the fluid tank 30 occurs, the liquid chemical is supplied from the second fluid tank 30b to the cleaning means and continuous supply of the liquid chemical to the cleaning means can be performed.

The second provision tube 40b, the second provision valve 41b, the second tank drain tube 60b, and the second tank drain valve 61b are substantially the same to the configurations of the provision tube 40, the provision valve 41, the tank drain tube 60, and the tank drain valve 61, except that the configurations thereof are related to the second fluid tank 30b, and additional descriptions thereof will be omitted.

The controller (not shown) controls opening and closing of each of the supply valve 11, the drain valve 21, the provision valve 41, the tank drain valve 61, and the second tank drain valve 61b and supply of a liquid chemical supplying via the supply tube 10.

Hereinbelow, a method for supplying, by the controller, a liquid chemical to the fluid tank 30 or the second fluid tank 30b will be described.

According to a control of the controller, the method for supplying the liquid chemical to the fluid tank 30 is performed in order of determining whether or not to fill a liquid chemical S21, draining operation S22, first pre-draining operation S23, second pre-draining operation S24, supplying of a liquid chemical S25, as shown in FIG. 2. Since the method is related to the process of supplying the liquid chemical to the fluid tank 30, the second provision tube 40b connected to the second fluid tank 30b remains closed.

The determining whether or not to fill a liquid chemical S21 is performed by determining whether or not filling (supply) of a liquid chemical to the fluid tank 30 or the second fluid tank 30b is required, and according to a result of the determining whether or not to fill a liquid chemical S21, when it is determined that supply of a liquid chemical is required, the draining of a tank S22, the first pre-draining operation S23, the second pre-draining operation S24, and the supplying S25 of a liquid chemical are performed.

In the determining whether or not to fill a liquid chemical S21, whether or not filling of a liquid chemical is required may be determined by considering a time elapsed after the liquid chemical is filled into the fluid tank 30 or the second fluid tank 30b and a level (water level), which is measured by the level sensor, of the liquid chemical stored in the fluid tank 30. When a time elapsed after the liquid chemical is filled into the fluid tank 30 or the second fluid tank 30b is equal to or greater than the predetermined time (e.g., 300 minutes) or a level of the liquid chemical stored in the fluid tank 30 or the second fluid tank 30b is less than or equal to the predetermined level (e.g., ⅕ of level in full filling), newly filling of a liquid chemical may be performed.

The draining operation S22 is performed by draining (discharging) the liquid chemical stored in the fluid tank 30 or the second fluid tank 30b, via the tank drain tube 60 or the second tank drain tube 60b. To this end, as shown in FIG. 8, the tank drain valve 61 or the second tank drain valve 61b is opened to drain the liquid chemical stored in the fluid tank 30 or the second fluid tank 30b. the liquid chemical stored in the fluid tank 30 or the second fluid tank 30b for a long time has a tendency in which particles increase (referring to the graph in FIG. 1), and in some cases, physical properties required for the process are lowered, so that it is preferable that the liquid chemical stored in the fluid tank 30 or the second fluid tank 30b is discharged before the liquid chemical is newly supplied and stored in the fluid tank 30 or the second fluid tank 30b. When draining of the liquid chemical stored in the fluid tank 30 or the second fluid tank 30b is completed, the tank drain valve 61 or the second tank drain valve 61b is closed.

Meanwhile, the draining operation S22 may be omitted. In other words, in the state where the liquid chemical remains in the fluid tank or the second fluid tank 30b, a liquid chemical may be newly filled.

The first pre-draining operation S23 is performed by draining the liquid chemical detained in the supply tube 10. As shown in FIG. 9, the first pre-draining operation S13 is performed while the supply valve 11 and the drain valve 21 are opened and the provision valve 41 and the second provision valve 41b are closed. Then, when a liquid chemical is supplied via the supply tube 10, the supplied liquid chemical is drained via the drain tube 20 in a direction of the arrow shown in FIG. 9, and at this time, the liquid chemical detained in the supply tube 10 is discharged together. As described above, particles may increase and physical properties of the liquid chemical may be lowered also in the liquid chemical detained in the tube, so the liquid chemical detained in the tube is removed. A time of performing the first pre-draining operation S23 may be determined depending on a fluid (liquid chemical) flow rate, and the first pre-draining operation S23 is performed longer than the time for all the liquid chemical detained in the supply tube 10 to be drained.

The second pre-draining operation S24 is performed by opening the provision valve 41 or the second provision valve 41b and supplying liquid chemical via the supply tube 10 while the first pre-draining operation S23 is completed (the supply valve 11 and the drain valve 21 are opened). Some of the liquid chemical supplied via the supply tube is discharged via the drain tube 20 and some thereof is supplied to the fluid tank 30 or the second fluid tank 30b via the provision tube or the second provision tube 40b. FIG. 10 shows a valve state and a flow (arrow) of fluid in the second pre-draining operation S24. In FIG. 10, it is shown that the provision valve 41 is opened and the second provision valve 41b is closed, and on the other hand, the second provision valve 41b may be opened while the provision valve 41 is closed.

A reason of going through the second pre-draining operation S24 has been described above, and the description thereof will be omitted.

Meanwhile, in the embodiment, the second pre-draining operation S24 may be performed while the tank drain valve 61 or the second tank drain valve 61b is opened, and the stage is described in the prior embodiment, so the drawing or additional description thereof will be omitted.

The supplying of a liquid chemical S25 is performed by closing the drain valve 21 after the second pre-draining operation S24 to allow the liquid chemical supplied via the supply tube 10 to be stored in the fluid tank 30 or the second fluid tank 30b while passing through the provision tube 40 or the second provision tube 40b. FIG. 11 shows a valve state and a flow of a liquid chemical in the supplying of a liquid chemical.

When the supplying of a liquid chemical S25 is completed by closing the supply valve 11 and the provision valve 41, a liquid chemical may be supplied from the fluid tank 30 or the second fluid tank 30b to semiconductor manufacturing equipment such as the cleaning means.

Meanwhile, the liquid chemical drained by the drain tube 20, the tank drain tube 60, and the second tank drain tube 60b may be stored in a drain box 2.

Hereinbelow, an embodiment of the wafer cleaning apparatus, which is a second form of the present disclosure, will be described with reference to the accompanying drawings.

FIG. 12 is a view showing a wafer cleaning apparatus according to an embodiment of the present disclosure.

The wafer cleaning apparatus according to the embodiment includes a fluid supply means and the cleaning means.

The fluid supply means has substantially the same configuration to the second embodiment of the fluid supply device described above, so the detailed description thereof will be omitted.

As shown in FIG. 12, the cleaning means includes a support unit 100, a fluid supply unit 200, and a spray unit 300.

The support unit 100 supports a wafer w in the cleaning process. The support unit 100 may include a spin head 101, a spindle 102, and a rotation member 103.

A recovery container 110 and an elevation unit 120 may be provided around the spin head 101, and the recovery container 110 is provided to collect a liquid chemical, which is sprayed to the wafer w and falls down after cleaning the wafer or is scattered from the wafer w, and the elevation unit 120 is provided to move the recovery container 110 in a vertical direction.

The fluid supply unit 200 is configured to selectively supply the liquid chemical from the fluid tank 30 or the second fluid tank 30b of the fluid supply means. The fluid tank 30 and the second fluid tank 30b are indicated in the right lower side of the drawing, and a supply line of a liquid chemical is indicated with a dotted line. As described above, by using the two fluid tanks, when a demand of supplying a liquid chemical to any one fluid tank 30 or 30b occurs and the liquid chemical is supplied by the fluid supply means described above, the liquid chemical can be continuously supplied to the cleaning means.

The fluid supply unit 200 may include a tube, a valve, a pump, etc.

The spray unit 300 is configured to spray the liquid chemical supplied by the fluid supply unit 200 to the wafer w in order to clean the wafer w. The spray unit 300 may include a nozzle head 301 and a nozzle arm 302. The configuration of the nozzle head 301 and the nozzle arm 302 is known, and additional descriptions thereof will be omitted.

With the above-described configuration, the amount of particles contained in the liquid chemical (cleaning liquid) supplied to the fluid tank 30 or the second fluid tank 30b is minimized, thereby minimizing particles remained on the wafer after cleaning the wafer.

Hereinabove, although the exemplary embodiments of the present disclosure have been disclosed, the specific details for embodying the present disclosure has been provided. The scope and spirit of the present disclosure are not limited to the described embodiments, and various embodiments are possible without departing from the scope and spirit of the present disclosure.

What is claimed is:

1. A fluid supply device comprising:
a supply tank storing a liquid chemical;
a supply tube connected to the supply tank;
a supply valve provided at the supply tube;
a branch tube connected to the supply tube;
a first drain tube connected to the supply tube via the branch tube;
a first drain valve provided at the first drain tube;
a provision tube connected to the branch tube;
a fluid tank connected to the provision tube;
a provision valve provided at the provision tube, wherein the liquid chemical is provided into the fluid tank via the supply tube, the provision tube, and the branch tube connecting the supply tube and the provision tube with each other;
a second drain tube connected to the fluid tank to drain a liquid chemical in the fluid tank;
a second drain valve provided at the second drain tube; and
a controller configured to control opening and closing of each of the supply valve, the first drain valve, the provision valve, and the second drain valve to supply the liquid chemical from the supply tank to the fluid tank, wherein the controller is configured to perform:
a first pre-draining operation, in which, during a time when the supply valve and the first drain valve are opened and the provision valve is closed, the liquid chemical is supplied via the supply tube from the supply tank to drain the liquid chemical detained in the supply tube and the liquid chemical supplied via the supply tube via the first drain tube for a preset time;
a second pre-draining operation, in which after the first pre-draining operation is completed, during a time when the provision valve is opened, the liquid chemical is supplied via the supply tube from the supply tank, some of the supplied liquid chemical is discharged via the first drain tube, and some of the supplied liquid chemical is supplied to the fluid tank via the supply tube and the provision tube; and
a liquid supplying operation, in which, after the second pre-draining operation is completed, during a time when the opened first drain valve is closed, the liquid chemical is supplied to the fluid tank via the supply tube, the provision tube, and the branch tube connecting the supply tube and the provision tube with each other.

2. The fluid supply device of claim 1,
wherein the controller is configured to further perform:
draining operation that drains the fluid tank, before the first pre-draining operation is performed, during a time when the second drain valve is opened to drain a liquid chemical stored in the fluid tank via the second drain tube.

3. The fluid supply device of claim 1,
wherein the controller is configured to perform determining whether or not to fill a liquid chemical into the fluid tank, and
wherein, when it is determined to fill the liquid chemical in the fluid tank, the first pre-draining operation, the second pre-draining operation, and the liquid supplying operation are performed.

4. The fluid supply device of claim 2,
wherein the controller is configured to perform determining whether or not to fill a liquid chemical into the fluid tank, and
wherein, when it is determined that the liquid chemical is filled into the fluid tank, the draining of the fluid tank, the first pre-draining operation, the second pre-draining operation, and the liquid supplying operation are performed.

5. The fluid supply device of claim 3,
wherein a level sensor is provided at the fluid tank to detect a level of the liquid chemical, and
wherein the determining whether or not to fill a liquid chemical is performed by considering a level of the liquid chemical remaining in the fluid tank detected by the level sensor.

6. The fluid supply device of claim 3,
wherein the determining whether or not to fill a liquid chemical is performed by considering a retention time of liquid chemical filled in the fluid tank.

7. The fluid supply device of claim 1,
wherein, during the second pre-draining operation, the second drain valve is configured to be opened to drain the liquid chemical supplied to the fluid tank for a pre-determined time, and
wherein, during the liquid supplying operation, the second drain valve is configured to be closed and the liquid chemical is stored in the fluid tank.

8. The fluid supply device of claim 3,
wherein, during the second pre-draining operation, the second drain valve is configured to be opened to drain the liquid chemical supplied to the fluid tank for a preset time, and
wherein, during the liquid supplying operation, the second drain valve is configured to be closed and the liquid chemical is stored in the fluid tank.

9. The fluid supply device of claim 5,
wherein, during the second pre-draining operation, the second drain valve is configured to be opened to drain the liquid chemical supplied to the fluid tank for a preset time, and
wherein, during the liquid supplying operation, the second drain valve is configured to be closed and the liquid chemical is stored in the fluid tank.

10. A fluid supply device comprising:
a supply tank storing a liquid chemical;
a supply tube connected to the supply tank;
a supply valve provided at the supply tube;
a branch tube connected to the supply tube;

a first drain tube connected to the supply tube via the branch tube;

a first drain valve provided at the first drain tube;

a first provision tube connected to the branch tube;

a first provision valve provided at the first provision tube;

a first fluid tank connected to the first provision tube, wherein the liquid chemical is provided into the first fluid tank via the supply tube, the first provision tube, and the branch tube connecting the supply tube and the first provision tube with each other;

a second drain tube connected to the first fluid tank to drain a liquid chemical in the first fluid tank;

a second drain valve provided at the second drain tube;

a second provision tube connected to the branch tube;

a second provision valve provided at the second provision tube;

a second fluid tank connected to the second provision tube;

a third drain tube connected to the second fluid tank to drain a liquid chemical in the second fluid tank;

a third drain valve provided at the third drain tube; and a controller configured to control opening and closing of each of the supply valve, the first drain valve, the first provision valve, the second drain valve, the third drain valve, to supply the liquid chemical from the supply tank to the first fluid tank or the second fluid tank, wherein, the controller is configured to perform:

a first pre-draining operation, in which, during a time when the supply valve and the first drain valve are opened and the first provision valve and the second provision valve are closed, the liquid chemical is supplied via the supply tube from the supply tank to drain the liquid chemical detained in the supply tube and the liquid chemical supplied via the supply tube via the first drain tube for a preset time;

a second pre-draining operation, in which after the first pre-draining operation is completed, during a time when the supply valve is opened and the liquid chemical is supplied via the supply tube from the supply tank some of the supplied liquid chemical is discharged via the first drain tube, and some of the supplied liquid chemical is supplied to the first fluid tank or the second fluid tank via the first provision tube or the second provision tube; and a liquid supplying operation, in which, after the second pre-draining operation is completed, during a time when the opened first drain valve is closed, the liquid chemical is selectively supplied to the first fluid tank or the second fluid tank via the supply tube and the first provision tube or the second provision tube.

11. The fluid supply device of claim 10, wherein, the controller is configured to further perform:

draining the first fluid tank, before the first pre-draining operation is performed, during a time when the second drain valve or the third drain valve is opened to drain the liquid chemical stored in the first fluid tank or the second fluid tank via the second drain tube or the third drain tube.

12. The fluid supply device of claim 10, wherein the controller is configured to:

perform determining whether or not to fill a liquid chemical into the first fluid tank or the second fluid tank, and perform, in response to the determination of filling the liquid chemical in the first fluid tank or the second fluid tank, the first pre-draining operation, the second pre-draining operation, and the liquid supplying operation.

13. The fluid supply device of claim 11, wherein the controller is configured to perform determining whether or not to fill a liquid chemical into the first fluid tank or the second fluid tank, and wherein, when it is determined that the liquid chemical is filled into the first fluid tank or the second fluid tank, the draining of the first fluid tank, the first pre-draining operation, the second pre-draining operation, and the liquid supplying operation are performed.

14. The fluid supply device of claim 12, wherein a level sensor is provided at the first fluid tank or the second fluid tank to detect a level of the liquid chemical, and wherein the determining whether or not to fill a liquid chemical is performed based on a level of the liquid chemical remaining in the first fluid tank or the second fluid tank detected by the level sensor.

15. The fluid supply device of claim 12, wherein the determining whether or not to fill a liquid chemical is performed based on a retention time of liquid chemical filled in the first fluid tank or the second fluid tank.

16. The fluid supply device of claim 10, wherein, during the second pre-draining operation, the second drain valve or the third drain valve is configured to be opened to drain the liquid chemical supplied to the first fluid tank or the second fluid tank for a preset time, and wherein, during the liquid supplying operation, the second drain valve or the third drain valve is configured to be closed and the liquid chemical is stored in the first fluid tank or the second fluid tank.

17. The fluid supply device of claim 12, wherein, during the second pre-draining operation, the second drain valve or the third drain valve is configured to be opened to drain the liquid chemical supplied to the first fluid tank or the second fluid tank for a predetermined time, and wherein, during the liquid supplying operation, the second drain valve or the third drain valve is configured to be closed and the liquid chemical is stored in the first fluid tank or the second fluid tank.

18. The fluid supply device of claim 14, wherein, during the second pre-draining operation, the second drain valve or the third drain valve is configured to be opened to drain the liquid chemical supplied to the first fluid tank or the second fluid tank for a preset time, and wherein, during the liquid supplying operation, the second drain valve or the third drain valve is configured to be closed and the liquid chemical is stored in the first fluid tank or the second fluid tank.

19. The fluid supply device of claim 10, wherein the first fluid tank and the second fluid tank are configured to selectively supply the liquid chemical to a cleaning apparatus attached to the fluid supply device.

20. A wafer cleaning apparatus comprising a fluid supply means and a cleaning means, wherein the fluid supply means comprises:

a supply tank storing a liquid chemical;

a supply tube connected to the supply tank;

a supply valve provided at the supply tube;

a branch tube connected to the supply tube;

a first drain tube connected to the supply tube via the branch tube;

a first drain valve provided at the first drain tube;

a first provision tube connected to the branch tube;

a first provision valve provided at the first provision tube;

a first fluid tank connected to the first provision tube, wherein the liquid chemical is provided into the first fluid tank via the supply tube, the first provision tube, and the branch tube connecting the supply tube and the first provision tube with each other;

a second drain tube connected to the first fluid tank to drain a liquid chemical in the first fluid tank;

a first tank drain valve provided at the second drain tube;

a second provision tube connected to the branch tube;

a second provision valve provided at the second provision tube;

a second fluid tank connected to the second provision tube;

a third drain tube connected to the second fluid tank to drain a liquid chemical in the second fluid tank;

a second tank drain valve provided at the third drain tube; and a controller configured to control opening and closing of each of the supply valve, the first drain valve, the first provision valve, the first tank drain valve, the second tank drain valve, to supply the liquid chemical from the supply tank to the first fluid tank or the second fluid tank, wherein the controller is configured to perform:

determining whether or not the first fluid tank or the second fluid tank is filled with the liquid chemical;

draining operation, wherein the first tank drain valve or the second tank drain valve is opened to drain the liquid chemical stored in the first fluid tank or the second fluid tank via the second drain tube or the third drain tube;

a first pre-draining operation, in which, during a time when the supply valve and the first drain valve are opened and the first provision valve and the second provision valve are closed, the liquid chemical is supplied via the supply tube from the supply tank to drain the liquid chemical detained in the supply tube and the liquid chemical supplied via the supply tube via the first drain tube for a preset time;

a second pre-draining operation, in which after the first pre-draining operation is completed, during a time when the first provision valve is opened the liquid chemical is supplied via the supply tube from the supply tank some of the supplied liquid chemical is discharged via the first drain tube, and some of the supplied liquid chemical is supplied to the first fluid tank or the second fluid tank via the first provision tube or the second provision tube; and a liquid supplying operation, in which, after the second pre-draining operation is completed, during a time when the opened drain valve is closed, the liquid chemical is selectively supplied to the first fluid tank or the second fluid tank via the supply tube and the first provision tube or the second provision tube, and wherein the cleaning means comprises:

a support unit configured to support a wafer;

a fluid supply unit configured to supply the liquid chemical from the first fluid tank or the second fluid tank; and a spray unit configured to spray the liquid chemical supplied by the fluid supply unit to the wafer in order to clean the wafer.

* * * * *